United States Patent
Kim et al.

(10) Patent No.: US 11,248,978 B2
(45) Date of Patent: Feb. 15, 2022

(54) WIRELESS PRESSURE DETECTOR, WIRELESS PRESSURE MEASURING SYSTEM, AND PRESSURE MEASURING METHOD

(71) Applicant: CORNING INCORPORATED, Corning, NY (US)

(72) Inventors: Sangmo Kim, Cheonan-si (KR); Dong-un Lee, Gwangjin-gu (KR); Hak-kyung Lee, Bundang-gu (KR); Ho-jin Lim, Gangseo-gu (KR); Eun-Woo Park, Suwon-si (KR); Jun-uk Park, Cheonan-si (KR)

(73) Assignee: Corning Incorporated, Corning, NY (US)

( * ) Notice: Subject to any disclaimer, the term of this patent is extended or adjusted under 35 U.S.C. 154(b) by 307 days.

(21) Appl. No.: 16/473,111

(22) PCT Filed: Dec. 26, 2017

(86) PCT No.: PCT/KR2017/015440
§ 371 (c)(1),
(2) Date: Jun. 24, 2019

(87) PCT Pub. No.: WO2018/124679
PCT Pub. Date: Jul. 5, 2018

(65) Prior Publication Data
US 2019/0346326 A1    Nov. 14, 2019

(30) Foreign Application Priority Data

Dec. 27, 2016  (KR) ......................... 10-2016-0180137
Dec. 21, 2017  (KR) ......................... 10-2017-0177491

(51) Int. Cl.
*G01L 19/08*  (2006.01)
*G01L 1/20*   (2006.01)
(Continued)

(52) U.S. Cl.
CPC ............ *G01L 19/086* (2013.01); *G01L 1/205* (2013.01); *B08B 13/00* (2013.01); *H03M 1/12* (2013.01)

(58) Field of Classification Search
CPC ....... G01L 19/08; G01L 19/086; G01L 1/205; G01L 1/2287; G01L 1/16; G01L 1/146;
(Continued)

(56) References Cited

U.S. PATENT DOCUMENTS 9,784,626 B2   10/2017  Chen et al.
2005/0179531 A1*  8/2005  Tabe ................... B60C 23/0408
                                                340/447

FOREIGN PATENT DOCUMENTS

CN    1266535 A    9/2000
CN    1538154 A   10/2004
(Continued)

OTHER PUBLICATIONS

International Search Report of the International Searching Authority; PCT/KR2017/015440; dated Mar. 27, 2018; 3 Pages; Korean Intellectual Property Office.
(Continued)

*Primary Examiner* — Tung S Lau
(74) *Attorney, Agent, or Firm* — Ryan T. Hardee

(57) ABSTRACT

Provided is a wireless pressure detector. The wireless pressure detector includes: a support substrate; a plurality of pressure sensors arranged on the support substrate, each of the plurality of pressure sensors being configured to output a signal in response to a pressure applied thereto; and a transmitter configured to perform wireless transmission based on signals input from the plurality of pressure sensors.

18 Claims, 10 Drawing Sheets

(51) Int. Cl.
*B08B 13/00* (2006.01)
*H03M 1/12* (2006.01)

(58) Field of Classification Search
CPC ....... G01L 19/083; B08B 13/00; B08B 11/00; H03M 1/12
See application file for complete search history.

(56) References Cited

FOREIGN PATENT DOCUMENTS

| | | | | |
|---|---|---|---|---|
| CN | 101201279 A | | 6/2008 | |
| CN | 201310028374 A | * | 1/2013 | ............... A61B 5/11 |
| CN | 103411710 A | | 11/2013 | |
| CN | 103411710 A | * | 11/2013 | ............... G01L 1/16 |
| CN | 103728056 A | | 4/2014 | |
| CN | 204091443 U | | 1/2015 | |
| CN | 104819803 A | | 8/2015 | |
| CN | 105136369 A | | 12/2015 | |
| JP | 10038720 A | | 2/1998 | |
| JP | 2012-083364 A | | 4/2012 | |
| JP | 2015155866 A | | 8/2015 | |
| JP | 2016-075672 A | | 5/2016 | |
| JP | 6280660 B2 | * | 2/2018 | ............... A61B 5/031 |
| KR | 1020080041839 A | | 5/2008 | |
| KR | 1020110040648 A | | 4/2011 | |
| KR | 10-2013-0058265 A | | 6/2013 | |
| TW | 201829996 A | * | 8/2018 | ............. G01L 1/146 |

OTHER PUBLICATIONS

Chinese Patent Application No. 201780080832.0, Office Action dated Mar. 26, 2021, 17 pages (6 pages of English Translation and 11 pages of Original Document).
Chinese Patent Application No. 201780080832.0 First Office Action dated Sep. 1, 2020: 23 Pages; (14 pages of English Translation and 9 pages of Original Document).
International Search Report and Written Opinion of the International Searching Authority; PCT/KR2017/015440; dated Mar. 27, 2018; 12 Pages; Korean Intellectual Property Office.
Wang et al., "A flexible touch-pressure sensor array with wireless transmission system for robotic skin", Review of Scientific Instruments, Jun. 2016, 87(6):065007.
Japanese Patent Application No. 2019-534847, Office Action dated Sep. 27, 2021, 4 pages (2 pages of English Translation and 2 pages of Original Document), Japanese Patent Office.

* cited by examiner

[Fig. 1]
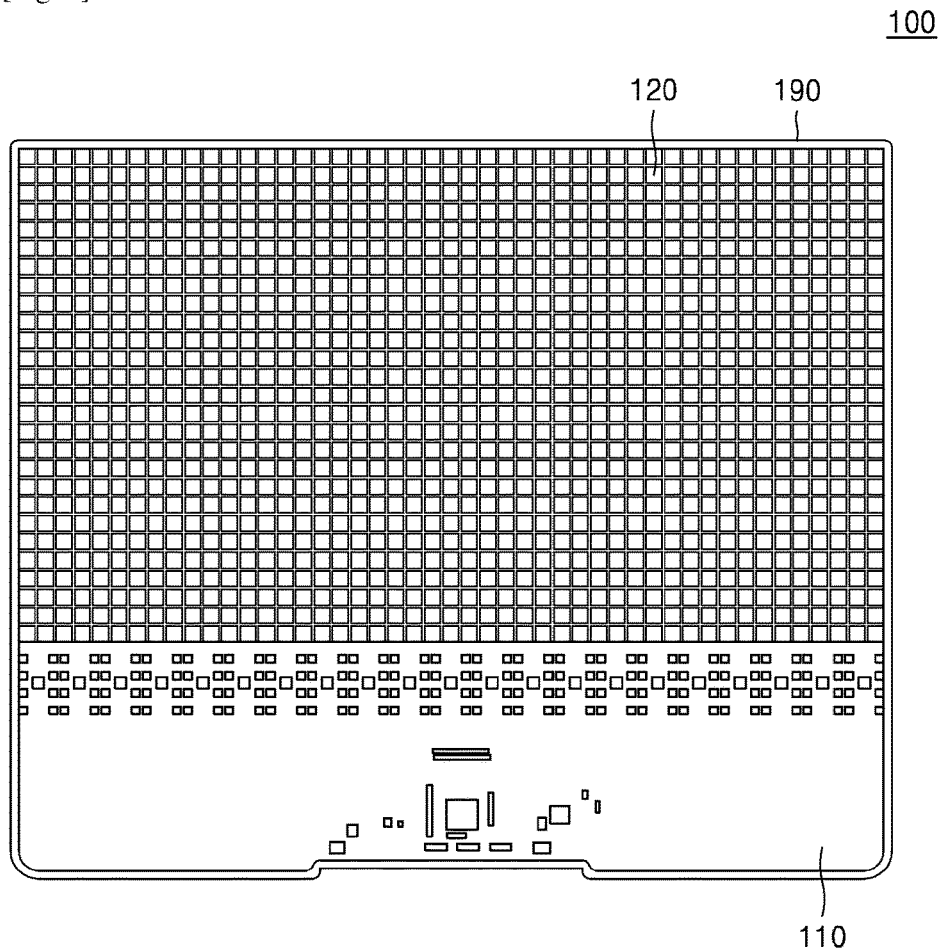
[Fig. 2]
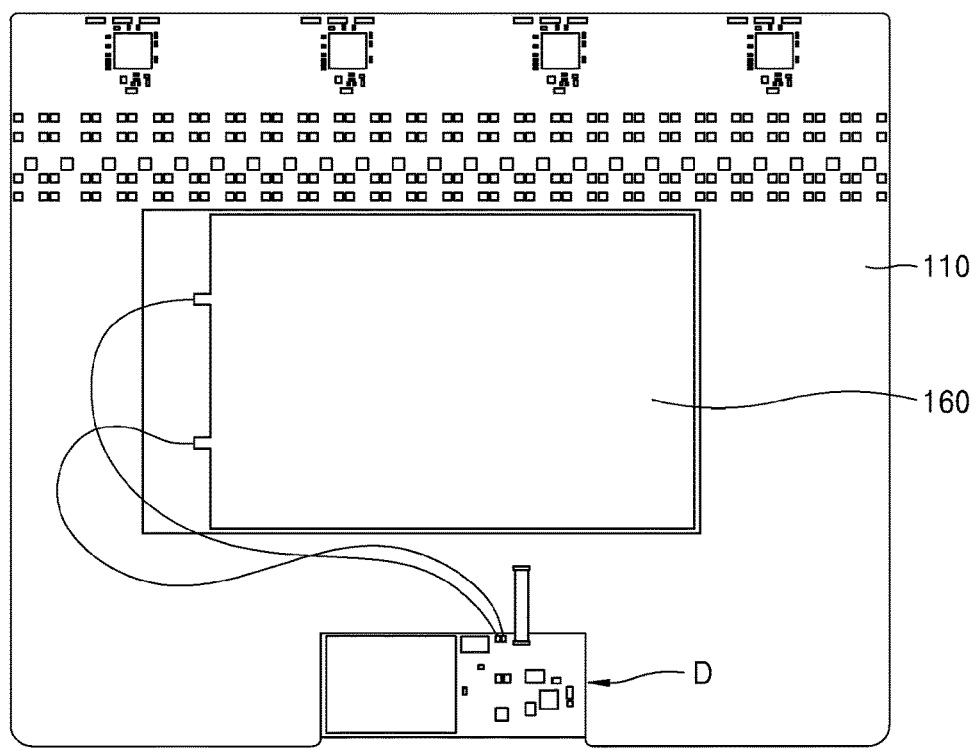

[Fig. 3a]
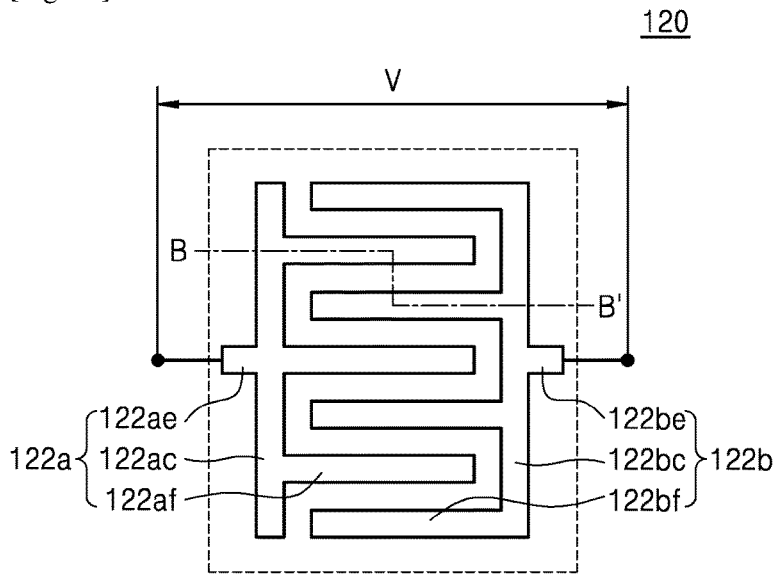
[Fig. 3b]
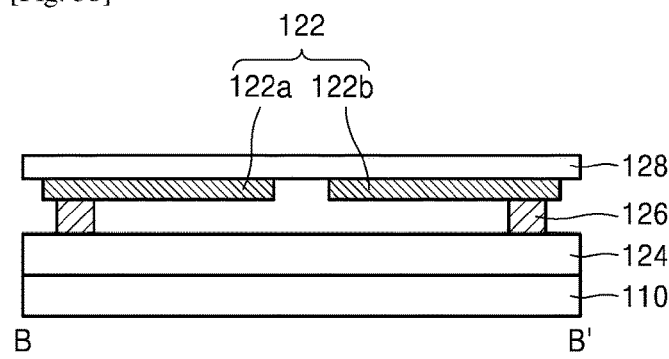
[Fig. 4a]
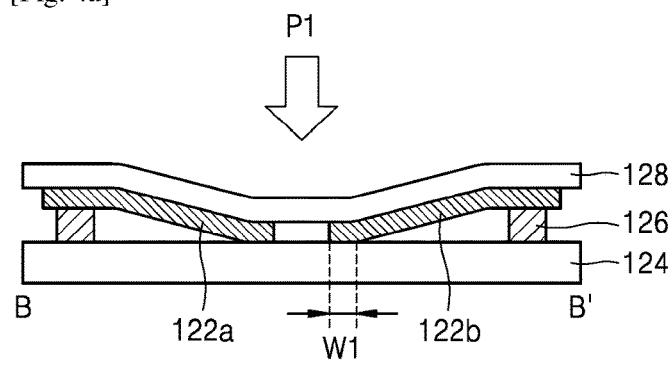
[Fig. 4b]
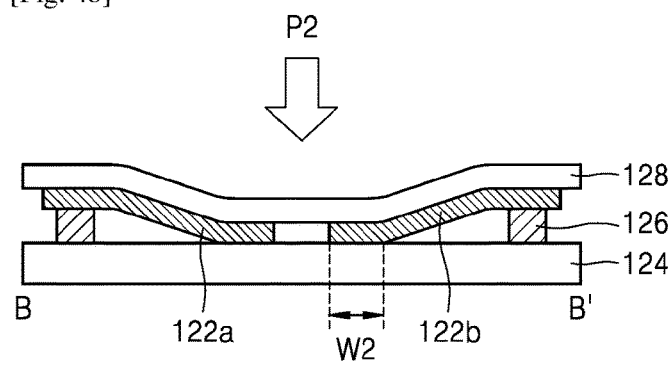

[Fig. 5]
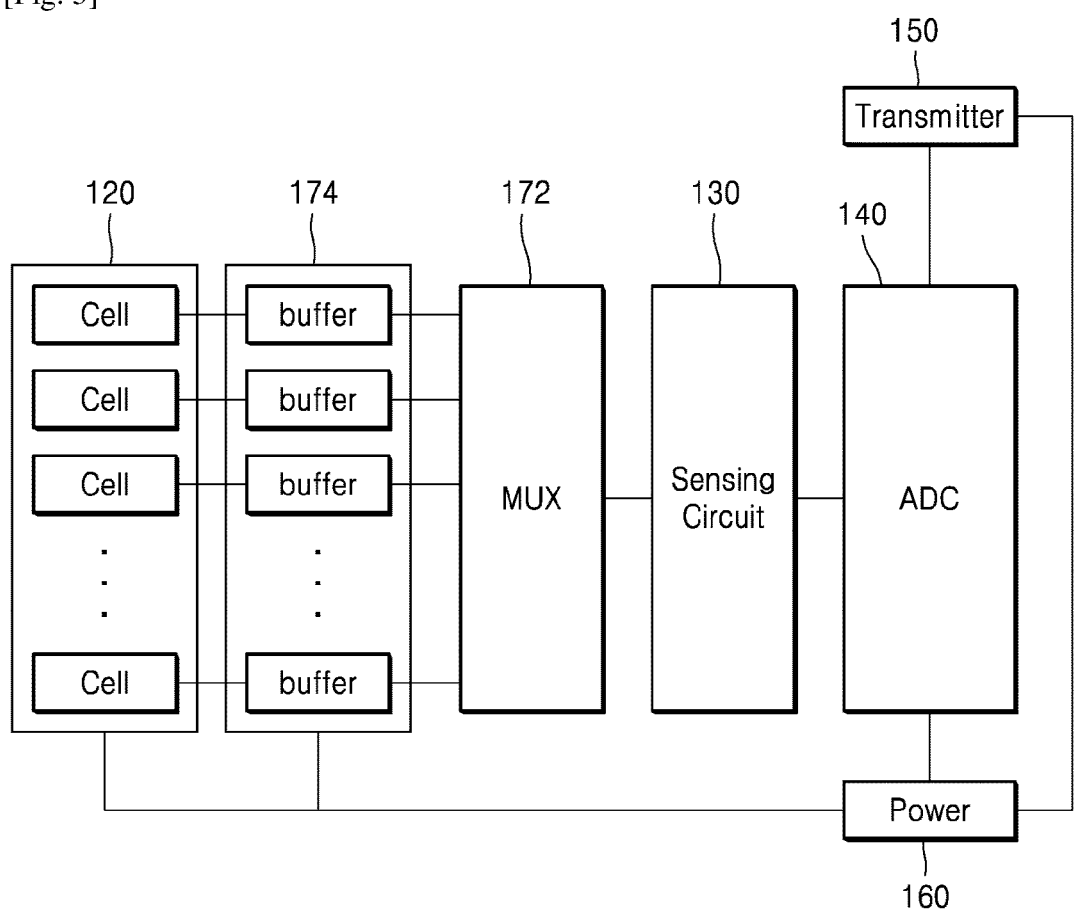

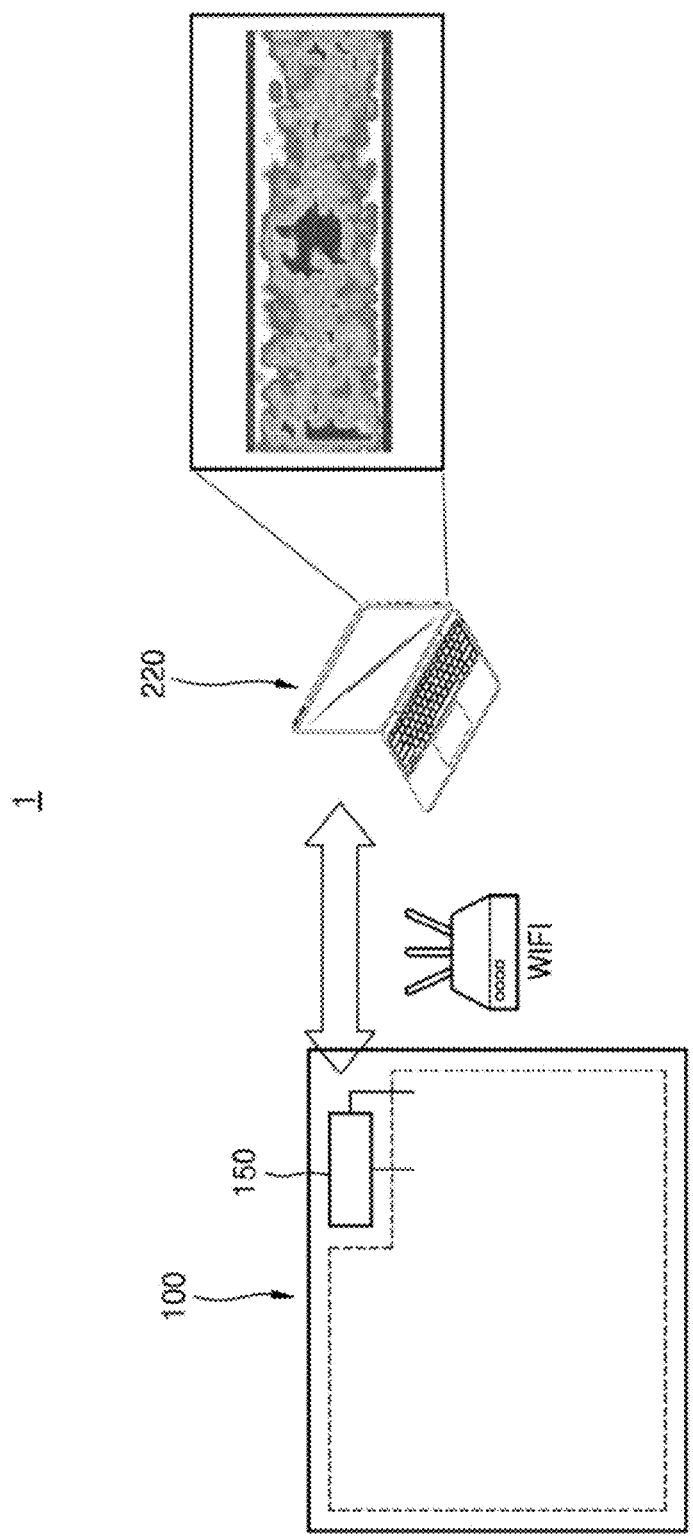

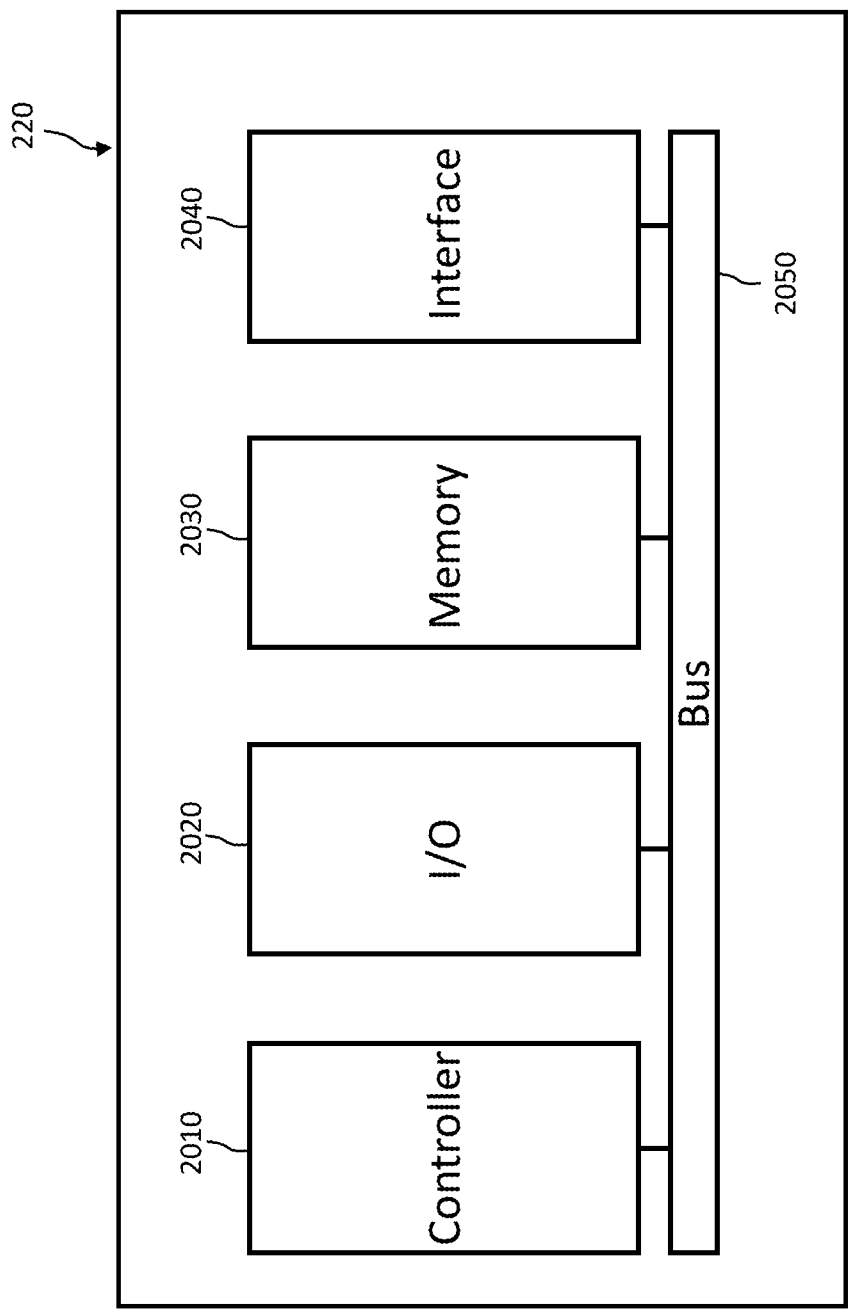
[Fig. 6B]

[Fig. 7]
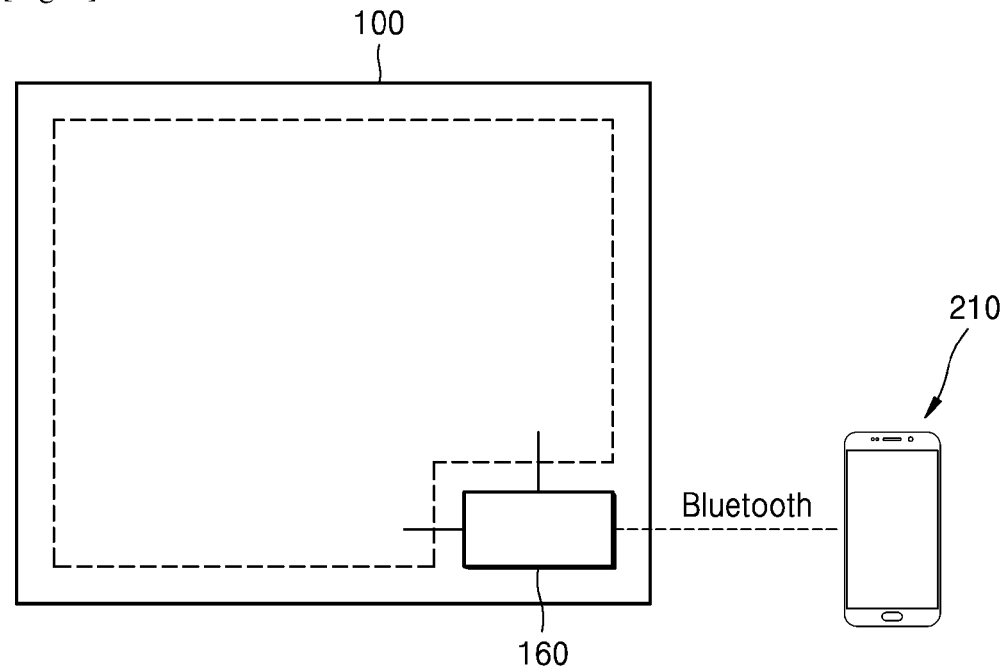
[Fig. 8a]
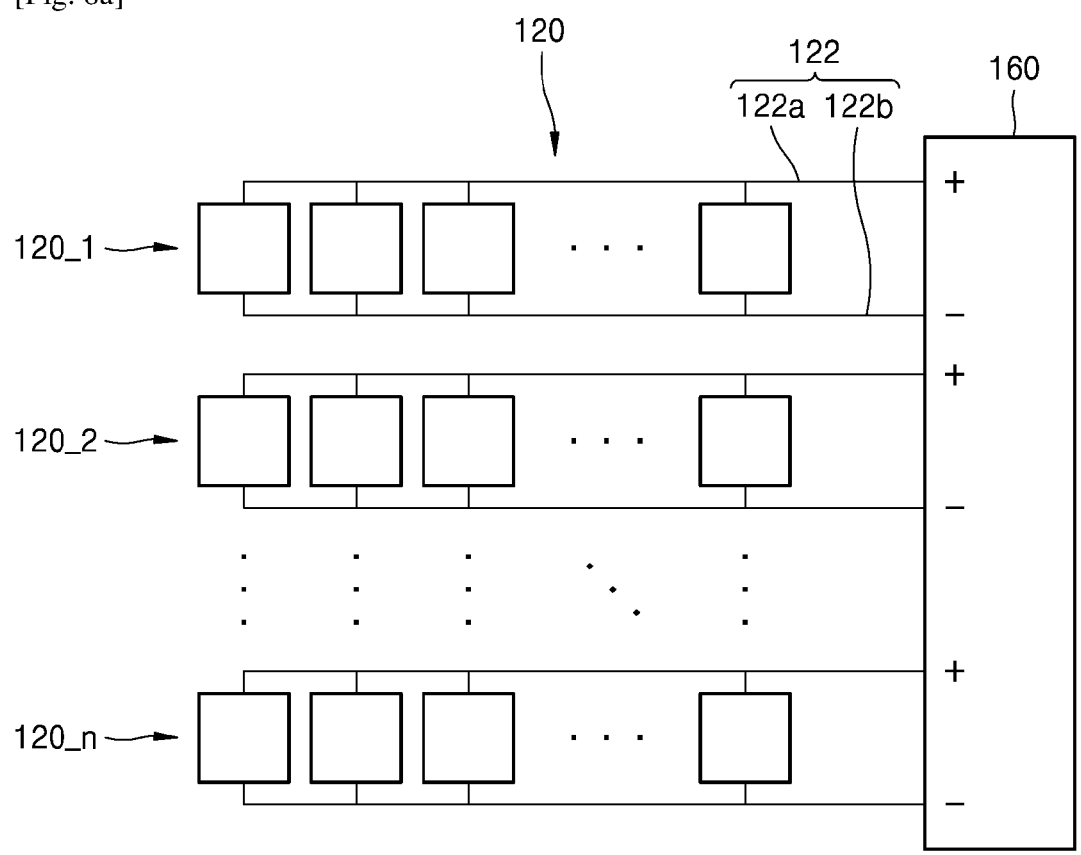

[Fig. 8b]
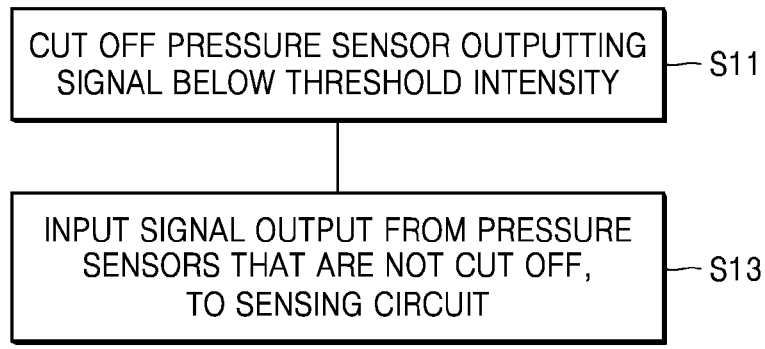
[Fig. 9]
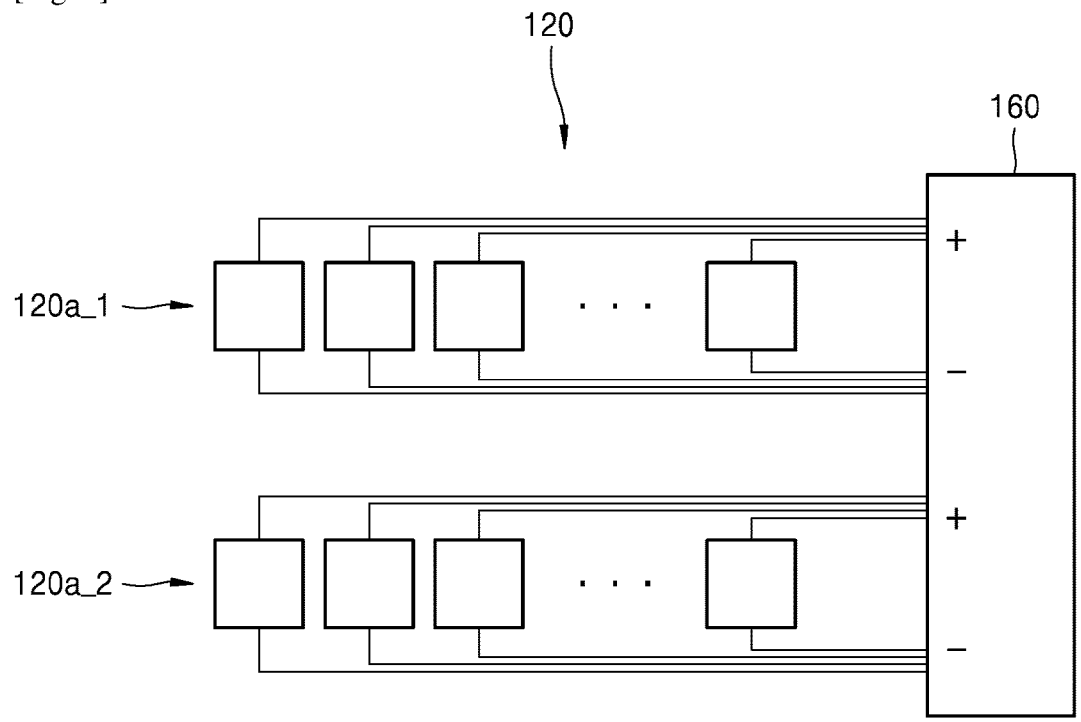

[Fig. 10]
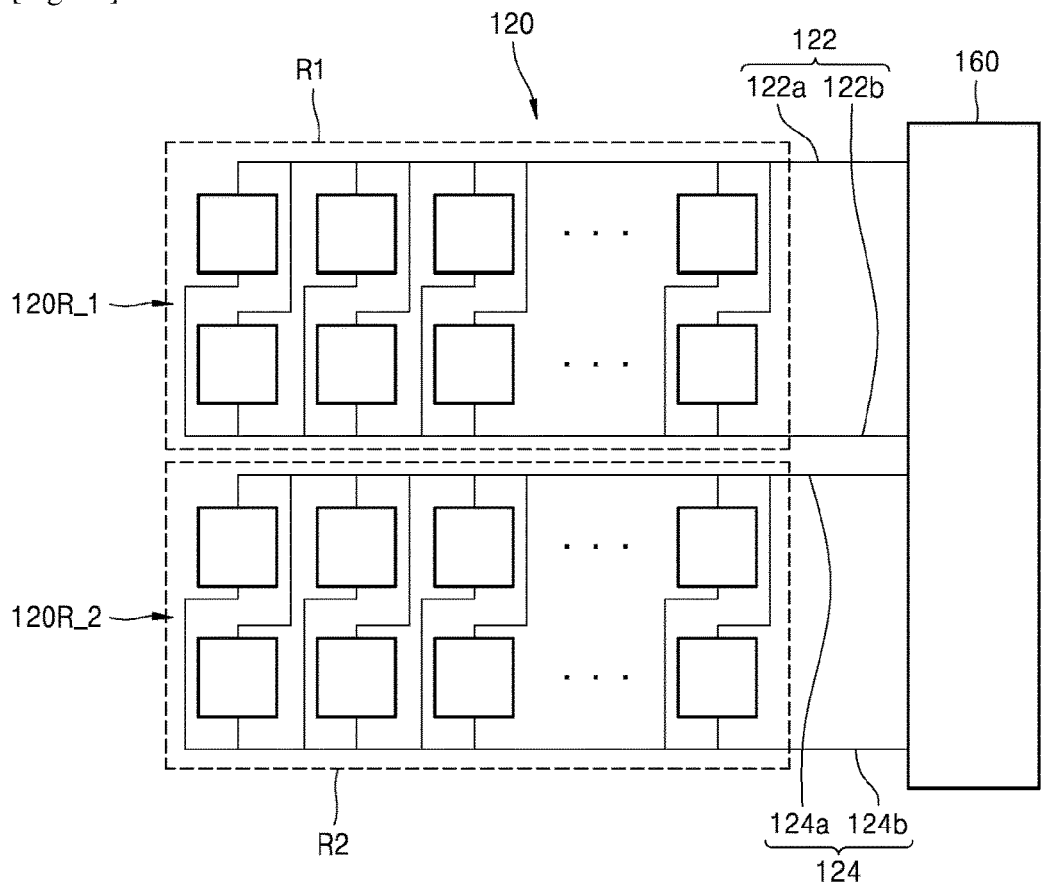
[Fig. 11]
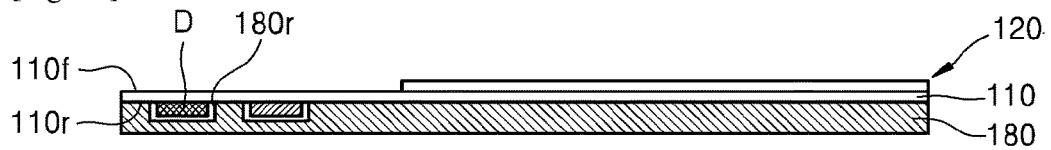
[Fig. 12]
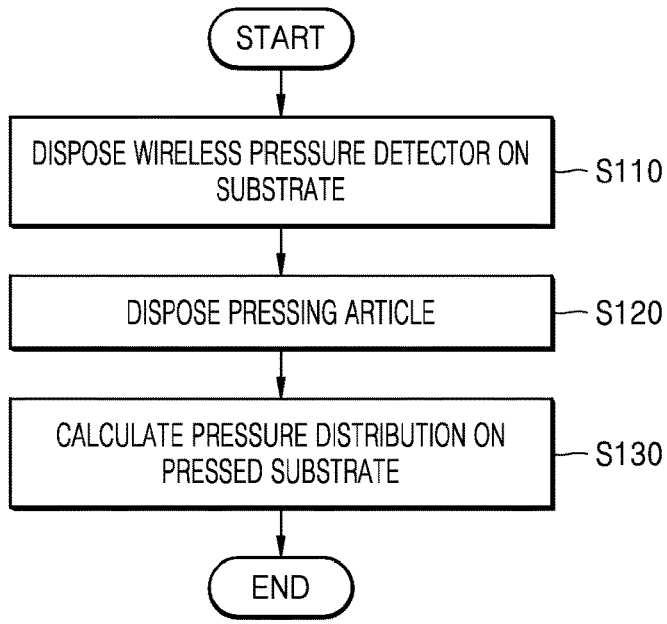

[Fig. 13]
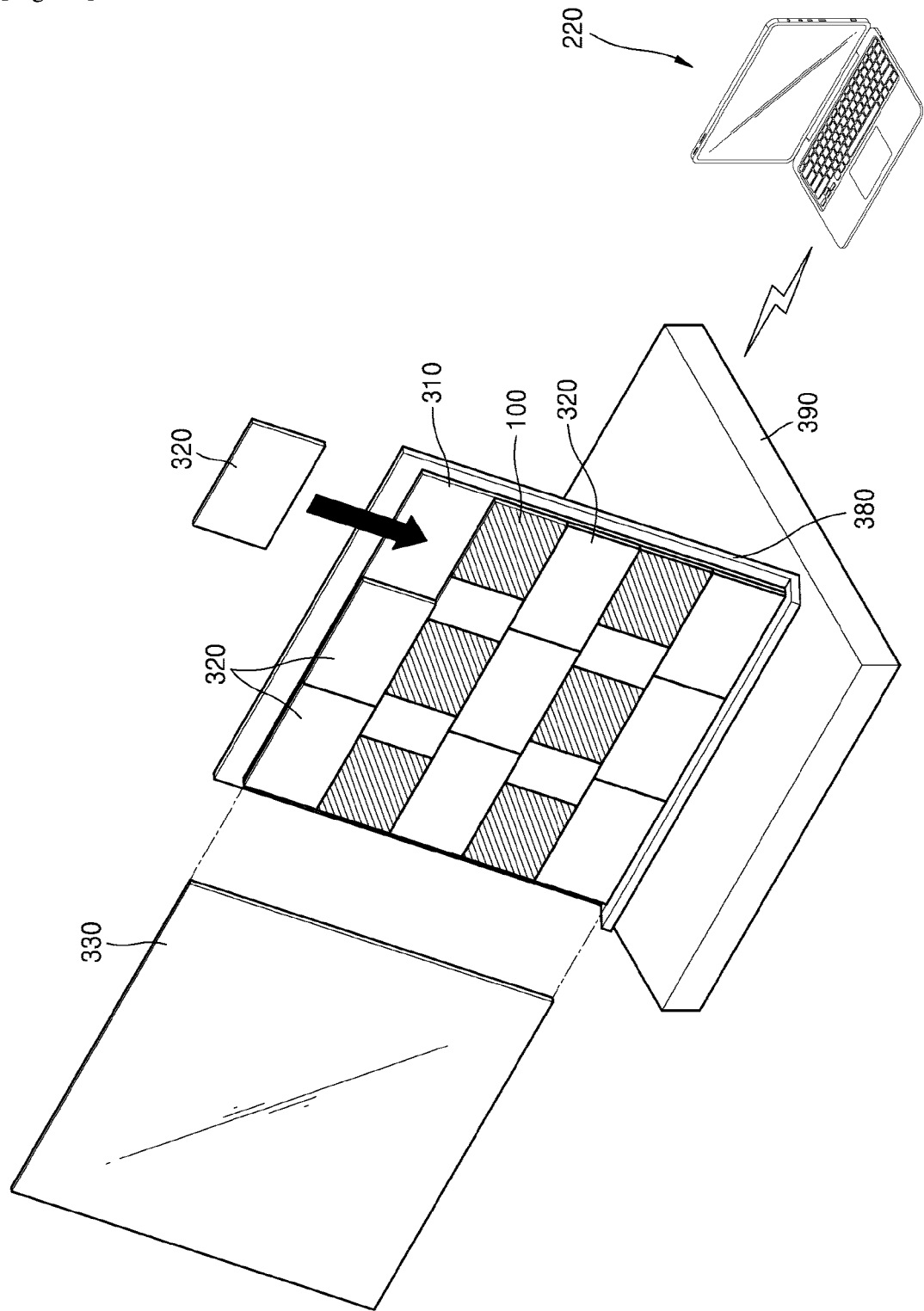

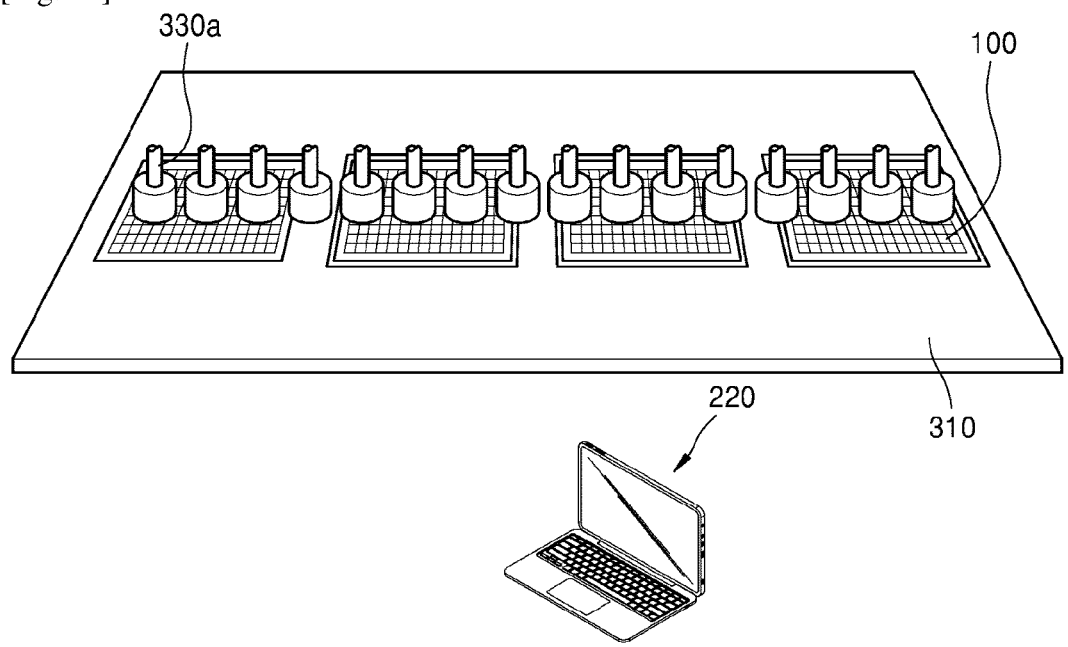
[Fig. 14]

WIRELESS PRESSURE DETECTOR, WIRELESS PRESSURE MEASURING SYSTEM, AND PRESSURE MEASURING METHOD

CROSS-REFERENCE TO RELATED APPLICATIONS

This application is a national stage entry of International Patent Application Serial No. PCT/KR2017/015440, filed on Dec. 26, 2017, which in turn, claims the benefit of priority under 35 U.S.C. § 119 of Korean Patent Application Nos. 10-2016-0180137 and 10-2017-0177491, respectively filed on Dec. 27, 2016 and Dec. 21, 2017, the contents of which are relied upon and incorporated herein by reference in their entirety.

TECHNICAL FIELD

One or more embodiments relate to wireless pressure detectors, wireless pressure measuring systems, and pressure measuring methods, and more particularly, to wireless pressure detectors, wireless pressure measuring systems, and pressure measuring methods, which may quickly and easily measure in real time an accurate distribution of pressure applied onto a two-dimensional plane.

BACKGROUND ART

As consumer demand for glass substrates with high surface quality has increased and glass substrates having larger area are used more and more, the possibility of occurrence of particle defects during a process of manufacturing a glass substrate has increased.

Regarding a glass substrate manufacturing process, there is few equipment for an objective and quantitative test or evaluation of a cleaning process, and thus, reducing the occurrence of particle defects is difficult. Also, it is required to reduce non-uniformity in substrate quality which is caused by deviation between workers in the cleaning process.

DISCLOSURE OF INVENTION

Technical Problem

One or more embodiments include wireless pressure detectors that may quickly and easily detect in real time an accurate distribution of pressure applied onto a two-dimensional plane.

One or more embodiments include wireless pressure measuring systems that may quickly and easily measure in real time an accurate distribution of pressure applied onto a two-dimensional plane.

One or more embodiments include wireless pressure measuring systems, and pressure measuring methods that may quickly and easily measure in real time an accurate distribution of pressure applied onto a two-dimensional plane.

Solution to Problem

Additional aspects will be set forth in part in the description which follows and, in part, will be apparent from the description, or may be learned by practice of the presented embodiments.

According to one or more embodiments, a wireless pressure detector includes: a support substrate; a plurality of pressure sensors arranged on the support substrate, each of the plurality of pressure sensors being configured to output a signal in response to a pressure applied thereto; and a transmitter configured to perform wireless transmission based on signals input from the plurality of pressure sensors.

In some embodiments, the wireless pressure detector may further include an analog-to-digital converter configured to receive a signal corresponding to the pressure from the pressure sensors and convert the received signal into a digital signal, wherein the transmitter may be configured to wirelessly transmit a signal output from the analog-to-digital converter.

In some embodiments, the wireless pressure detector may further include a power supply configured to supply power to the pressure sensors and the transmitter.

In some embodiments, the support substrate, the plurality of pressure sensors, the analog-to-digital converter, the transmitter, and the power supply may be accommodated and sealed in a protection cover.

In some embodiments, the plurality of pressure sensors may be arranged in a lattice array, and the pressure sensors disposed in a line in a first direction among the plurality of pressure sensors may be connected in parallel to a common power line extending from the power supply. Also, the wireless pressure detector may further include a sensing circuit configured to receive a signal from the plurality of pressure sensors and perform: a first operation of cutting off the pressure sensors outputting a signal below a threshold strength; and a second operation of receiving a signal output from the pressure sensors that are not cut off.

Alternatively, each of the plurality of pressure sensors may be directly connected in parallel to the power supply.

Alternatively, the plurality of pressure sensors may include first pressure sensors arranged in a lattice array in a first region and second pressure sensors arranged in a lattice array in a second region. In this case, the first pressure sensors may be connected in parallel to a first common power line extending from the power supply, the second pressure sensors may be connected in parallel to a second common power line extending from the power supply, and the first common power line and the second common power line may be different from each other.

The support substrate may include a printed circuit board. Particularly, the pressure sensors may be disposed on a first surface of the printed circuit board, and the transmitter may be mounted on a second surface opposite to the first surface. In some embodiments, the second surface may be covered with a flat plate, and the flat plate may have a recess configured to accommodate the transmitter.

According to one or more embodiments, a wireless pressure measuring system includes: a wireless pressure detector configured to measure a pressure applied to a pressed substrate and wirelessly transmit the measured pressure; and an analyzer configured to receive data transmitted from the wireless pressure detector and output a pressure map for the pressed substrate.

According to one or more embodiments, a pressure measuring method for measuring a pressure applied to a pressed substrate includes: disposing a wireless pressure detector on the substrate, the wireless pressure detector including a support substrate, a plurality of pressure sensors arranged on the support substrate, each of the plurality of pressure sensors being configured to output a signal in response to a pressure applied thereto, and a transmitter configured to perform wireless transmission based on signals input from the plurality of pressure sensors; disposing a pressing article on the wireless pressure detector; and calculating a pressure distribution on the pressed substrate by using an analyzer configured to wirelessly receive signals transmitted from the transmitter and analyze a pressure distribution on the pressed substrate.

In some embodiments, the pressed substrate may include a glass substrate, and the pressing article may include a friction cleaning part. In other embodiments, the pressed substrate and the pressing article may include a glass substrate.

In some embodiments, a planar area of the wireless pressure detector may be smaller than a planar area of the pressed substrate, and a dummy substrate having a thickness substantially equal to a thickness of the wireless pressure detector may be disposed adjacently in a direction parallel to a main surface of the wireless pressure detector.

In some embodiments, the wireless pressure detector may be configured to be turned on and off in a Bluetooth manner.

In some embodiments, each of the plurality of pressure sensors may include an upper conductor layer and a lower conductor layer, the lower conductor layer being separated from the upper conductor layer and disposed under the upper conductor layer, the upper conductor layer may include a first conductor part including a first electrode and a second conductor part including a second electrode, and the upper conductor layer may be deformed by the applied pressure to contact the lower conductor layer.

BRIEF DESCRIPTION OF DRAWINGS

These and/or other aspects will become apparent and more readily appreciated from the following description of the embodiments, taken in conjunction with the accompanying drawings in which:

FIG. 1 is a schematic diagram conceptually illustrating a front surface of a wireless pressure detector according to an embodiment;

FIG. 2 is a schematic diagram conceptually illustrating a rear surface of the wireless pressure detector according to an embodiment;

FIG. 3A is a conceptual diagram illustrating a pressure sensor according to an embodiment;

FIG. 3B is a side cross-sectional view taken along line B-B' in FIG. 3A according to an embodiment;

FIGS. 4A and 4B are side cross-sectional views schematically illustrating deformation states of first and second fingers caused by the pressure applied thereto according to an embodiment;

FIG. 5 is a block diagram schematically illustrating a wireless pressure detector according to an embodiment;

FIG. 6A is a conceptual diagram schematically illustrating a wireless pressure measuring system according to an embodiment;

FIG. 6B is a block diagram of an analyzer according to an embodiment;

FIG. 7 is a conceptual diagram schematically illustrating an on/off process of a wireless pressure detector according to an embodiment;

FIG. 8A is a conceptual diagram illustrating a manner in which a plurality of pressure sensors are electrically connected to a power supply according to an embodiment;

FIG. 8B is a block diagram illustrating a two-step pressure measurement algorithm according to an embodiment;

FIG. 9 is a conceptual diagram illustrating a manner in which a plurality of pressure sensors are electrically connected to a power supply according to another embodiment;

FIG. 10 is a conceptual diagram illustrating a manner in which a plurality of pressure sensors are electrically connected to a power supply according to another embodiment;

FIG. 11 is a side cross-sectional view of a wireless pressure detector according to an embodiment;

FIG. 12 is a flowchart illustrating a pressure measuring method according to an embodiment; and FIGS. 13 and 14 are conceptual diagrams illustrating methods of measuring a pressure applied to a pressed substrate by using a wireless pressure detector according to an embodiment.

BEST MODE FOR CARRYING OUT THE INVENTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the inventive concept will be described in detail with reference to the accompanying drawings. However, the inventive concept may be embodied in many different forms and should not be construed as being limited to the embodiments described below. The embodiments of the inventive concept may be interpreted as being provided to more fully describe the inventive concept to those of ordinary skill in the art. Like reference numerals denote like elements throughout. Also, various elements and regions in the drawings are illustrated schematically. Thus, the inventive concept is not limited by the relative sizes or distances illustrated in the accompanying drawings.

Although terms such as "first" and "second" may be used herein to describe various elements or components, the elements or components should not be limited by the terms. These terms are only used to distinguish one element or component from another element or component. For example, without departing from the spirit and scope of the inventive concept, a first element may be referred to as a second element, and similarly, the second element may be referred to as the first element.

The terminology used herein is for the purpose of describing particular embodiments only and is not intended to limit the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by those of ordinary skill in the art to which the inventive concept belongs. Also, it will be understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

In the accompanying drawings, variations from the illustrated shapes may be expected as a result of, for example, manufacturing techniques and/or tolerances. Thus, the embodiments of the inventive concept should not be construed as being limited to the particular shapes of regions illustrated herein but may include deviations in shapes that result, for example, from manufacturing processes. The term "and/or" used herein includes any and all combinations of one or more of the associated listed components. Also, the term "substrate" used herein may refer to a substrate itself or a stack structure including a substrate and a layer or film formed thereon. Also, the term "substrate surface" used herein may refer to an exposed surface of a substrate itself or an outer surface of a layer or film formed on a substrate.

FIG. 1 is a schematic diagram conceptually illustrating a front surface of a wireless pressure detector 100 according to an embodiment. FIG. 2 is a schematic diagram conceptually illustrating a rear surface of the wireless pressure detector 100 according to an embodiment.

Referring to FIG. 1, the wireless pressure detector 100 may include: a support substrate 110; a plurality of pressure sensors 120 arranged on the support substrate 110; and a transmitter 150 configured to perform wireless transmission based on signals input from the plurality of pressure sensors 120.

The support substrate 110 may be a rigid printed circuit board or a flexible printed circuit board. The support substrate 110 may include a substrate base, and a top pad (not illustrated) and a bottom pad (not illustrated) formed respectively on a top surface and a bottom surface thereof. The top pad and the bottom pad may be exposed respectively by solder resist layers (not illustrated) covering a top surface and a bottom surface of the substrate base. The substrate base may include at least one of phenol resin, epoxy resin, and polyimide. For example, the substrate base may include at least one of FR4, tetrafunctional epoxy, polyphenylene ether, epoxy/polyphenylene oxide, bismaleimide triazine (BT), Thermount, cyanate ester, polyimide, and liquid crystal polymer. The top pad and the bottom pad may include copper, nickel, stainless steel, or beryllium copper. In the substrate base, internal wiring (not illustrated) may be formed to electrically connect the top pad and the bottom pad. The top pad and the bottom pad may be portions exposed respectively by the solder resist layers, among the circuit wiring patterned after coating the top surface and the bottom surface of the substrate base with copper (Cu) foil.

The plurality of pressure sensors 120 may be arranged at regular intervals or at irregular intervals on the support substrate 110. The pressure sensors 120 may be configured to output an electrical signal in response to the pressure applied to an upper portion thereof. FIG. 3A is a conceptual diagram illustrating a pressure sensor 120 according to an embodiment. FIG. 3B is a side cross-sectional view taken along line B-B' in FIG. 3A according to an embodiment.

Referring to FIGS. 3A and 3B, the pressure sensor 120 may include an upper conductor layer 122 and a lower conductor layer 124.

The upper conductor layer 122 may include a first conductor part 122a and a second conductor part 122b. The first conductor part 122a may include a first electrode 122ae, and the second conductor part 122b may include a second electrode 122be.

The upper conductor layer 122 may include a metal material, and for example, may include copper (Cu), aluminum (Al), nickel (Ni), zinc (Zn), iron (Fe), gold (Au), silver (Ag), platinum (Pt), cobalt (Co), tungsten (W), titanium (Ti), tantalum (Ta), chromium (Cr), manganese (Mn), zirconium (Zr), or an alloy thereof, but is not limited thereto. In some embodiments, the upper conductor layer 122 may include a carbon-based material having conductivity, such as graphite, graphene, carbon nanotube (CNT), and fullerene.

The first conductor part 122a and the second conductor part 122b may be spaced apart from each other by a certain distance. In some embodiments, the first conductor part 122a may include a plurality of first fingers 122af arranged in parallel and a first connection part 122ac connecting the plurality of first fingers 122af. In some embodiments, the second conductor part 122b may include a plurality of second fingers 122bf arranged in parallel and a second connection part 122bc connecting the plurality of second fingers 122bf.

As illustrated in FIG. 3A, the plurality of first fingers 122af and the plurality of second fingers 122bf may be alternately arranged in parallel with respect to one another.

The first fingers 122af and the first connection part 122ac may be deformed by the pressure applied on an upper portion thereof to contact the lower conductor layer 124. Also, the second fingers 122bf and the second connection part 122bc may be deformed by the pressure applied on an upper portion thereof to contact the lower conductor layer 124. The deformation of the first and second fingers 122af and 122bf and the deformation of the first and second connection parts 122ac and 122bc may be proportional to the pressure applied on the upper portion thereof.

An upper insulation layer 128 may be provided on the upper conductor layer 122. The upper insulation layer 128 may act as a support substrate of the upper conductor layer 122 in the process of manufacturing the pressure sensor 120. Also, the upper insulation layer 128 may protect the upper conductor layer 122.

In some embodiments, an area where the first and second fingers 122af and 122bf and/or the first and second connection parts 122ac and 122bc contact the lower conductor layer 124 may depend on the pressure applied to the upper portion thereof. In detail, the area where the first and second fingers 122af and 122bf and/or the first and second connection parts 122ac and 122bc contact the lower conductor layer 124 may be proportional to the pressure applied to the upper portion thereof within a certain pressure range.

FIGS. 4A and 4B are side cross-sectional views schematically illustrating the deformation states of the first and second fingers 122af and 122bf caused by the pressure applied thereto according to an embodiment.

Referring to FIG. 4A, the first and second fingers 122af and 122bf may be deformed by a first pressure P1 to physically contact the lower conductor layer 124. In this case, the second fingers 122bf may each have a contact area corresponding to a width W1 and may contact the lower conductor layer 124.

Referring to FIG. 4B, when a second pressure P2 higher than the first pressure P1 is applied to the first and second fingers 122af and 122bf, the first and second fingers 122af and 122bf may be deformed more than in FIG. 4A and may contact the lower conductor layer 124. As the second fingers 122bf are deformed more, the second fingers 122bf may each have a contact area corresponding to a width W2 greater than the width W1 and may contact the lower conductor layer 124.

As the area where the first and second fingers 122*af* and 122*bf* and/or the first and second connection parts 122*ac* and 122*bc* contact the lower conductor layer 124 becomes wider, a current flowing through the lower conductor layer 124 may increase with a certain voltage applied between the first electrode 122*ae* and the second electrode 122*be*. Thus, a level of the applied pressure may be obtained by correlating the current with the applied pressure and measuring a value of the current.

The lower conductor layer 124 may be spaced apart from the upper conductor layer 122 and may be disposed under the upper conductor layer 122. The lower conductor layer 124 may include a conductor such as a metal material or a carbon-based material. The metal material or the carbon-based material used as a material of the lower conductor layer 124 is the same as that described above on the upper conductor layer 122, and thus, redundant descriptions thereof will be omitted for conciseness.

In FIG. 3B, the lower conductor layer 124 is illustrated as extending over an entire area of the support substrate 110, but is not limited thereto. In some embodiments, the lower conductor layer 124 may be restricted in a cell region including one pressure sensor 120. That is, lower conductor layers of two adjacent pressure sensors 120 may be electrically insulated from each other.

The upper conductor layer 122 and the lower conductor layer 124 may be electrically separated from each other by a spacer 126. When a pressure is applied on an upper portion of the upper conductor layer 122, the spacer 126 may maintain a gap between the upper conductor layer 122 and the lower conductor layer 124, and thus, separation may be maintained at a position at which the spacer 126 is disposed, and the upper conductor layer 122 may be deformed at a position at which the spacer 126 is not disposed.

The spacer 126 may include any electrical insulator, and for example, may include nonconductive polymer resin, metal oxide having electrical insulating properties, metal nitride having electrical insulating properties, undoped silicon oxide, undoped silicon nitride, or a combination thereof.

Referring again to FIG. 1, a protection cover 190 may be configured to surround the support substrate 110 including a surface on which the plurality of pressure sensors 120 are provided. The protection cover 190 may surround the support substrate 110, and for example, may prevent damage due to direct contact of the pressure sensors 120 with a glass substrate or may prevent a liquid component, such as water or chemicals used for cleaning, from directly contacting the pressure sensors 120.

The protection cover 190 may include a flexible material. In some embodiments, the protection cover 190 may include a material that is different from or the same as that of the support substrate 110. For example, the protection cover 190 may include polyethyleneterephthalate (PET), polyethylenenaphthalate, polybutyleneterephthalate (PBT), high density polyethylene (HDPE), low density polyethylene (LDPE), polypropylene (PP), polycarbonate (PC), polyvinylchloride (PVC), polymethyl(meth)acrylate (PMMA), triacetylcellulose, norbornene resin, polyester, or polystyrene (PS), but is not limited thereto.

The support substrate 110, the plurality of pressure sensors 120, a sensing circuit 130, an analog-to-digital converter (ADC) 140, the transmitter 150, and a power supply 160 may be accommodated in the protection cover 190. In some embodiments, the support substrate 110 may be sealed to be waterproof and/or moistureproof.

Referring to FIG. 2, in some embodiments, the power supply 160 may be provided on a rear surface of the support substrate 110. The power supply 160 may include a battery pack and a power control circuit configured to control power supplied from the battery pack. In some embodiments, the battery pack and the power supply circuit may be configured in one body.

Particularly, the power supply 160 may be configured to be wirelessly chargeable. For example, the power supply 160 may be configured to be wirelessly chargeable according to the ISO/IEC NP 15149 standard.

Also, one or more semiconductor devices D may be mounted on the rear surface of the support substrate 110. The semiconductor devices D may include a multiplexer (MUX) 172, a sensing circuit 130, an analog-to-digital converter (ADC) 140, and a transmitter 150 (see FIG. 5), which will be described later in more detail. The semiconductor devices D may be implemented in one semiconductor chip, or may be distributedly implemented in two or more semiconductor chips.

FIG. 5 is a block diagram schematically illustrating a wireless pressure detector 100 according to an embodiment.

Referring to FIG. 5, the wireless pressure detector 100 may include cells of a plurality of pressure sensors 120, a multiplexer (MUX) 172 receiving the signal output from the pressure sensors 120 and outputting the signal to an analog-to-digital converter (ADC) 140, a sensing circuit 130 processing the signals input from the pressure sensors 120, an analog-to-digital converter (ADC) 140 receiving the signal output from the sensing circuit 130, a transmitter 150 configured to receive the signal output from the analog-to-digital converter 140 and wirelessly transmit the received signal, and a power supply 160 configured to supply power the pressure sensors 120 and the transmitter 150.

The plurality of pressure sensors 120 may be arranged in a lattice form or a matrix form on the support substrate 110. The individual pressure sensors 120 of the plurality of pressure sensors 120 may be the same as or different from each other. Herein, each individual pressure sensor 120 may be referred to as a "cell". Information about the arrangement form of the plurality of pressure sensors 120 may be necessary to output a pressure map afterwards through data obtained from the individual pressure sensors 120.

In response to the pressures applied from outside to the plurality of pressure sensors 120, the signals output from the plurality of pressure sensors 120 may be input through buffers 174 to the multiplexer 172. The multiplexer 172 may sequentially transmit detected pressure information by connecting a plurality of input terminals to one output terminal. The sensing circuit 130 may be configured to variously process the signal output from the multiplexer 172. The analog-to-digital converter 140 may convert an analog signal received from the sensing circuit 130 into a digital signal.

The power supply 160 may be configured to supply power to the plurality of pressure sensors 120 and the transmitter 150. In some embodiments, the power supply 160 may be configured to supply power to the analog-to-digital converter 140, the sensing circuit 130, and the multiplexer 172.

The transmitter 150 may be configured to perform wirelessly transmission based on the signals input from the plurality of pressure sensors 120. In some embodiments, the transmitter 150 may be configured to transmit a signal based on the signals input from the plurality of pressure sensors 120 to an analyzer through a wireless network.

FIG. 6A is a conceptual diagram schematically illustrating a wireless pressure measuring system 1 according to an embodiment.

Referring to FIG. 6A, the transmitter 150 of the wireless pressure detector 100 may be connected to communicate data with an analyzer 220 through a wireless network, for example, a WiFi network. The analyzer 220 may be configured to output a pressure map by analyzing the pressure data received from the transmitter 150.

FIG. 6B is a block diagram of the analyzer 220 according to an embodiment.

Referring to FIG. 6B, the analyzer 220 may include a controller 2010, an input/output (I/O) device 2020, a memory 2030, and an interface 2040. These elements may be connected to each other through a bus 2050.

The controller 2010 may include at least one of a microprocessor, a digital signal processor, and any similar processing device. The I/O device 2020 may include at least one of a keypad, a keyboard, and a display. The memory 2030 may be used to store a command executed by the controller 2010. For example, the memory 2030 may be used to store user data.

In some embodiments, the interface 2040 may be configured to be connected to the transmitter 150 of the wireless pressure detector 100 (see FIG. 5) through a wireless network.

When the analyzer 220 receives a signal (or data) through the wireless network interface 2040, the analyzer 220 may process the signal (or data) to generate a pressure contour map as illustrated in FIG. 6A. An enlarged view of a display device in FIG. 6A is a pressure contour map illustrating a level of pressure with respect to an area and a position to which a pressure is applied by a wireless pressure detector manufactured according to an embodiment. The pressure contour map may be output through the I/O device 2020 such as a display device.

The analyzer 220 may include a program and/or a routine for generating the pressure contour map. The program and/or the routine is/are commercially available, and thus, detailed descriptions thereof will be omitted for conciseness.

FIG. 7 is a conceptual diagram schematically illustrating an on/off process of a wireless pressure detector 100 according to an embodiment.

Referring to FIG. 7, the on/off of the wireless pressure detector 100 may be controlled, for example, by a portable device 210. The portable device 210 may be, for example, a portable phone, a tablet computer, or a notebook computer, but is not limited thereto.

In some embodiments, the portable device 210 may control the on/off of the power supply 160 of the wireless pressure detector 100. For example, the portable terminal 210 may be configured to control an on/off operation by Bluetooth pairing with the power supply 160.

FIG. 8A is a conceptual diagram illustrating a manner in which the plurality of pressure sensors 120 are electrically connected to the power supply 160 according to an embodiment.

Referring to FIG. 8A, the plurality of pressure sensors 120 may be arranged in a lattice form, and may include pressure sensors of a first row 120_1, a second row 120_2, ..., an nth row 120_n that are arranged in the same direction.

A plurality of pressure sensors 120 of the first row 120_1 may be connected in parallel to a common power line 122. That is, first electrodes of the plurality of pressure sensors 120 of the first row 120_1 may be directly electrically connected to a first line 122a extending from the power supply 160. Also, second electrodes of the plurality of pressure sensors 120 of the first row 120_1 may be directly electrically connected to a second line 122b extending from the power supply 160. This connection relationship may be the same in a plurality of pressure sensors 120 of the second row 120_2, ..., the nth row 120_n.

This connection relationship may be manufactured easily and cheaply. However, in this connection relationship, interference of measurement values may occur between the pressure sensors 120 of the same row. Therefore, in the case of the embodiment illustrated in FIG. 8A, a two-step pressure measurement algorithm may be used to obtain high-reliability data while reducing this interference.

FIG. 8B is a block diagram illustrating a two-step pressure measurement algorithm according to an embodiment.

Referring to FIG. 8B, an input may be received from all of the plurality of pressure sensors 120, and it may be determined whether an intensity of an input signal is above a threshold intensity (S11). If an intensity of a signal input through a pressure sensor 120 is below the threshold intensity, a value thereof may be classified as a noise and a cell thereof may be cut off from the pressure detection target. That is, in this operation, a cell to which a pressure is applied and a cell to which a pressure is not applied may be determined with respect to all of the plurality of pressure sensors 120.

Thereafter, with respect to pressure sensors 120 that are not cut off, a signal output from the pressure sensors 120 may be transmitted to the sensing circuit 130 (S13).

For this operation, a semiconductor device (e.g., a device such as TS3A4751) having a high logic input, a low logic input, and an open switch may be used. However, the inventive concept is not limited thereto.

FIG. 9 is a conceptual diagram illustrating a manner in which the plurality of pressure sensors 120 are electrically connected to the power supply 160 according to another embodiment.

Referring to FIG. 9, each of the plurality of pressure sensors 120 may be connected in parallel to the power supply 160. In other words, among the plurality of pressure sensors 120, pressure sensors of a first row 120a_1 may be individually connected in parallel to the power supply 160. Also, among the plurality of pressure sensors 120, pressure sensors of a second row 120a_2 may be individually connected in parallel to the power supply 160.

Since this connection relationship may reduce the electrical interference between the pressure sensors 120, more reliable pressure data may be obtained.

FIG. 10 is a conceptual diagram illustrating a manner in which the plurality of pressure sensors 120 are electrically connected to the power supply 160 according to another embodiment.

Referring to FIG. 10, the plurality of pressure sensors 120 may include first pressure sensors 120R_1 disposed in a first region R1 and second pressure sensors 120R_2 disposed in a second region R2. Although FIG. 10 illustrates that the plurality of pressure sensors 120 include two regions, those of ordinary skill in the art will understand that the plurality of pressure sensors 120 may include three or more regions.

The pressure sensors 120 of each region may be arranged in a matrix form of p×q (where "p" and "q" are integers of 2 to 1,000). Although FIG. 10 illustrates that the first region R1 and the second region R2 have the same size and shape, those of ordinary skill in the art will understand that the first region R1 and the second region R2 may have different sizes and shapes.

The first pressure sensors 120R_1 may be connected in parallel to a first common power line 122 extending from the power supply 160. That is, first electrodes of a plurality of pressure sensors 120 of the first pressure sensors 120R_1 may be directly electrically connected to a first line 122*a* extending from the power supply 160. Also, second electrodes of a plurality of pressure sensors 120 of the first pressure sensors 120R_1 may be directly electrically connected to a second line 122*b* extending from the power supply 160.

The second pressure sensors 120R_2 may be connected in parallel to a second common power line 124 extending from the power supply 160. That is, first electrodes of a plurality of pressure sensors 120 of the second pressure sensors 120R_2 may be directly electrically connected to a first line 124*a* extending from the power supply 160. Also, second electrodes of a plurality of pressure sensors 120 of the second pressure sensors 120R_2 may be directly electrically connected to a second line 124*b* extending from the power supply 160.

The first power line 122 and the second power line 124 may be connected in common to the power supply 160, but may be different and separate lines.

FIG. 11 is a side cross-sectional view of a wireless pressure detector 100 according to an embodiment.

Referring to FIG. 11, a support substrate 110 may have a first surface 110*f* on which a plurality of pressure sensors 120 are mounted and a second surface 110*r* that is opposite to the first surface 110*f*.

A semiconductor device D may be mounted on the second surface 110*r*. The second surface 110*r* may be covered with a flat plate 180. The flat plate 180 may be a rigid or flexible flat surface. The flat plate 180 may have a recess 180*r* configured to accommodate the semiconductor device D.

A thickness of the flat plate 180 may be greater than a thickness of the semiconductor device D. Also, a depth of the recess 180*r* may be greater than or equal to a thickness of the semiconductor device D.

If the depth of the recess 180*r* is equal to the thickness of the semiconductor device D, even when the flat plate 180 is a flexible flat plate, a surface (a bottom surface in FIG. 10) of the flat plate 180 may be flat. If the flat plate 180 is a rigid flat plate, when the depth of the recess 180*r* is greater than or equal to the thickness of the semiconductor device D, a surface (a bottom surface in FIG. 10) of the flat plate 180 may be flat.

FIG. 12 is a flowchart illustrating a pressure measuring method according to an embodiment. FIGS. 13 and 14 are conceptual diagrams illustrating methods of measuring a pressure applied to a pressed substrate 310 by using a wireless pressure detector 100 according to an embodiment.

First, referring to FIGS. 12 and 13, a wireless pressure detector 100 according to an embodiment may be disposed on a pressed substrate 310 (S110).

FIG. 13 illustrates an Inclined Dense Pak (IDP) that may be used to transport a glass substrate. In the IDP, a substrate support 380 may be fixed on a support pallet 390. The substrate support 380 may have a surface on which stacked glass substrates may be loaded.

In FIG. 13, the pressed substrate 310 and a pressing article 330 may be glass substrates. In some embodiments, the pressed substrate 310 and the pressing article 330 may be glass substrates having the same type and/or the same size. Although FIG. 13 illustrates that each of the pressed substrate 310 and the pressing article 330 is one glass substrate, it may be a stack of two or more glass substrates, for example, 2 to 100 glass substrates, but is not limited thereto.

The size of the wireless pressure detector 100 may be smaller than the size of the pressed substrate 310. In this case, several wireless pressure detectors 100 (six wireless pressure detectors 100 in FIG. 13) may be arranged in a side direction to measure a pressure on a desired area.

Also, since the size of the wireless pressure detector 100 is smaller than the size of the pressed substrate 310, a dummy substrate 320 may be used to dispose the wireless pressure detector 100 at a position where a pressure is to be measured. The dummy substrate 320 may have substantially the same thickness as the wireless pressure detector 100. When the dummy substrate 320 is disposed on the same plane adjacently in a side direction with respect to a main surface of the wireless pressure detector 100, the dummy substrate 320 may support or fix the wireless pressure detector 100.

Since the dummy substrate 320 has substantially the same thickness as the wireless pressure detector 100, the wireless pressure detector 100 may accurately measure a pressure applied from the pressing article 330, without the interference caused by the thickness of the dummy substrate 320.

A size other than the thickness of the dummy substrate 320, for example, a size in a horizontal direction and/or a vertical direction in FIG. 13 may be adjusted suitably in consideration of a position where the wireless pressure detector 100 is to be disposed. In FIG. 13, the wireless pressure detector 100 is disposed at a position of about ⅓ and a position of about ⅔ with respect to a vertical direction of the pressed substrate 310. When glass substrates are transported by using the IDP, a retainer for holding the glass substrates may be disposed at this position (a position of about ⅓ and a position of about ⅔ with respect to a vertical direction of the pressed substrate 310) and this may be to measure a pressure distribution applied to the glass substrates by the retainer.

Subsequently, a pressing article 330 may be disposed on the wireless pressure detector 100 (S120). The pressing article 330 may be a glass substrate in the embodiment of FIG. 13. Although FIG. 13 illustrates that one pressed substrate 310 and one pressing article 330 are provided, the number of stacked glass substrates (i.e., pressed substrates 310 or pressing articles 330) and the disposition method of the wireless pressure detector 100 may be applied in various ways.

In some embodiments, a wireless pressure detector 100 may be disposed whenever 5 to 50 glass substrates are stacked. For example, 10 glass substrates may be stacked, and a wireless pressure detector 100 may be stacked thereon. Thereafter, 10 glass substrates may be again stacked, and an additional wireless pressure detector 100 may be stacked thereon. This stacking process may be repeated more. The wireless pressure detector 100 may be stacked together with a dummy substrate 320 as illustrated in FIG. 13.

In this manner, when a group of stacked glass substrates and wireless pressure detectors 100 are alternately repeatedly stacked, a glass substrate acting as a pressing article 330 may act as a pressed substrate 310 afterwards.

Subsequently, a pressure distribution on the pressed substrate 310 may be measured (S130). Data about the pressure applied from the pressing article 330 detected by the wireless pressure detector 100 may be wirelessly transmitted to the analyzer 220.

The data about the applied pressure may be transmitted from the wireless pressure detector 100 to the analyzer 220 through a wireless communication network. The wireless communication network may include, for example, WiFi, WCDMA (Wideband CDMA), HSDPA (High Speed Downlink Packet Access), HSUPA (High Speed Uplink Packet Access), HSPA (High Speed Packet Access), Mobile WiMAX, WiBro, LTE (Long Term Evolution), Bluetooth, IrDA (Infrared Data Association), NFC (Near Field Communication), ZigBee (IEEE 802.15.4), and/or Wireless LAN. Also, when a service is provided by connecting to the Internet, it may follow TCP/IP that is a standard protocol for information transmission on the Internet.

The analyzer 220 may calculate a pressure distribution on a pressed substrate based on the received data and visualize the same in a map form.

A pressure measuring method according to another embodiment will be described with reference to FIGS. 12 and 14. FIG. 14 illustrates a system for measuring a pressure applied from a friction cleaning part to a glass substrate when a surface of the glass substrate is cleaned with the friction cleaning part.

Referring to FIGS. 12 and 14, a wireless pressure detector 100 may be disposed on a glass substrate that is a pressed substrate 310 (S110). The pressed substrate 310 may travel in a viewing direction of FIG. 14 together with the wireless pressure detector 100 while being pressed by a pressing article 330a that will be described later. In other words, the pressed substrate 310 may travel in a direction perpendicular to an arrangement direction (a horizontal direction of FIG. 14) of pressing articles 330a.

Subsequently, a pressing article 330a may be disposed on the wireless pressure detector 100 (S120). The pressing article 330a may be, for example, one or more of brushes, woven fabrics, nonwoven fabrics, felts, sponges, and fabrics, but is not limited thereto.

The pressing article 330a may press the pressed substrate 310 (the glass substrate) for a cleaning purpose, but a pressure distribution of each pressing article 330a may not be uniform. Particularly, since a pressure degree of a pressing article 330a may be insufficient, it may cause a cleaning defect.

Subsequently, a pressure distribution on the pressed substrate 310 may be measured (S130). This has been described above in detail with reference to FIGS. 12 and 13, and thus, redundant descriptions thereof will be omitted for conciseness.

Although the embodiments of the inventive concept have been described above in detail, those of ordinary skill in the art may also implement the inventive concept in various other forms without departing from the spirit and scope of the inventive concept as defined by the following claims. Thus, further modifications of the embodiments of the inventive concept may not depart from the scope of the inventive concept.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

The invention claimed is:

1. A wireless pressure detector comprising:
   a support substrate;
   a plurality of pressure sensors arranged on the support substrate, each of the plurality of pressure sensors being configured to output a signal in response to a pressure applied thereto;
   a transmitter configured to perform wireless transmission based on signals input from the plurality of pressure sensors; and
   an analog-to-digital converter configured to receive a signal corresponding to the pressure from the pressure sensors and convert the received signal into a digital signal, wherein the transmitter is configured to wirelessly transmit a signal output from the analog-to-digital converter.

2. The wireless pressure detector of claim 1, further comprising a power supply configured to supply power to the pressure sensors and the transmitter.

3. The wireless pressure detector of claim 1, wherein the support substrate comprises a printed circuit board.

4. A wireless pressure measuring system comprising:
   the wireless pressure detector of claim 1 configured to measure a pressure applied to a pressed substrate and wirelessly transmit the measured pressure; and
   an analyzer configured to receive data transmitted from the wireless pressure detector and output a pressure map for the pressed substrate.

5. The wireless pressure detector of claim 2, wherein the support substrate, the plurality of pressure sensors, the analog-to-digital converter, the transmitter, and the power supply are accommodated and sealed in a protection cover.

6. The wireless pressure detector of claim 2, wherein the plurality of pressure sensors are arranged in a lattice array, and the pressure sensors disposed in a line in a first direction among the plurality of pressure sensors are connected in parallel to a common power line extending from the power supply.

7. The wireless pressure detector of claim 2, wherein each of the plurality of pressure sensors is directly connected in parallel to the power supply.

8. The wireless pressure detector of claim 2, wherein
   the plurality of pressure sensors comprise first pressure sensors arranged in a lattice array in a first region and second pressure sensors arranged in a lattice array in a second region,
   the first pressure sensors are connected in parallel to a first common power line extending from the power supply,
   the second pressure sensors are connected in parallel to a second common power line extending from the power supply, and
   the first common power line and the second common power line are different from each other.

9. The wireless pressure detector of claim 3, wherein the pressure sensors are disposed on a first surface of the printed circuit board, and
   the transmitter is mounted on a second surface opposite to the first surface.

10. The wireless pressure detector of claim 6, further comprising a sensing circuit configured to receive a signal from the plurality of pressure sensors and perform:
    a first operation of cutting off the pressure sensors outputting a signal below a threshold intensity; and
    a second operation of receiving a signal output from the pressure sensors that are not cut off.

11. The wireless pressure detector of claim 9, wherein the second surface is covered with a flat plate.

12. The wireless pressure detector of claim 11, wherein the flat plate has a recess configured to accommodate the transmitter.

13. A pressure measuring method for measuring a pressure applied to a pressed substrate, the pressure measuring method comprising:

disposing a wireless pressure detector on the substrate, the wireless pressure detector comprising a support substrate, a plurality of pressure sensors arranged on the support substrate, each of the plurality of pressure sensors being configured to output a signal in response to a pressure applied thereto, and a transmitter configured to perform wireless transmission based on signals input from the plurality of pressure sensors;

disposing a pressing article on the wireless pressure detector; and calculating a pressure distribution on the pressed substrate by using an analyzer configured to wirelessly receive signals transmitted from the transmitter and analyze a pressure distribution on the pressed substrate.

14. The pressure measuring method of claim 13, wherein the pressed substrate comprises a glass substrate, and the pressing article comprises a friction cleaning part.

15. The pressure measuring method of claim 13, wherein the pressed substrate and the pressing article comprise a glass substrate.

16. The pressure measuring method of claim 13, wherein the wireless pressure detector is configured to be turned on and off in a Bluetooth manner.

17. The pressure measuring method of claim 13, wherein each of the plurality of pressure sensors comprises an upper conductor layer and a lower conductor layer, the lower conductor layer being separated from the upper conductor layer and disposed under the upper conductor layer, the upper conductor layer comprises a first conductor part including a first electrode and a second conductor part including a second electrode, and the upper conductor layer is deformed by the applied pressure to contact the lower conductor layer.

18. The pressure measuring method of claim 15, wherein a planar area of the wireless pressure detector is smaller than a planar area of the pressed substrate, and a dummy substrate having a thickness substantially equal to a thickness of the wireless pressure detector is disposed adjacently in a direction parallel to a main surface of the wireless pressure detector.

* * * * *